(12) United States Patent
So et al.

(10) Patent No.: US 9,214,502 B2
(45) Date of Patent: Dec. 15, 2015

(54) PHOTODETECTOR AND UP-CONVERSION DEVICE WITH GAIN

(71) Applicants: University of Florida Research Foundation, Inc., Gainesville, FL (US); Nanoholdings, LLC, Rowayton, CT (US)

(72) Inventors: Franky So, Gainesville, FL (US); Do Young Kim, Gainesville, FL (US); Bhabendra K. Pradhan, Marietta, GA (US)

(73) Assignees: University of Florida Research Foundation, Inc., Gainesville, FL (US); Nanoholdings, LLC, Rowayton, CT (US)

( * ) Notice: Subject to any disclaimer, the term of this patent is extended or adjusted under 35 U.S.C. 154(b) by 0 days.

(21) Appl. No.: 14/568,794

(22) Filed: Dec. 12, 2014

(65) Prior Publication Data

US 2015/0171149 A1    Jun. 18, 2015

Related U.S. Application Data

(60) Division of application No. 14/463,546, filed on Aug. 19, 2014, which is a continuation of application No. 13/407,094, filed on Feb. 28, 2012, now Pat. No. 8,829,498.

(60) Provisional application No. 61/447,406, filed on Feb. 28, 2011.

(51) Int. Cl.
*H01L 21/00* (2006.01)
*H01L 27/32* (2006.01)
(Continued)

(52) U.S. Cl.
CPC ............ *H01L 27/3234* (2013.01); *G02B 23/12* (2013.01); *H01L 27/3227* (2013.01);
(Continued)

(58) Field of Classification Search
USPC ................. 438/59, 64, 48, 491; 257/E51.015, 257/E51.026, 21
See application file for complete search history.

(56) References Cited

U.S. PATENT DOCUMENTS 8,304,728 B2   11/2012   So
8,829,498 B2    9/2014   So et al.
(Continued)

FOREIGN PATENT DOCUMENTS

WO   WO 2007/017475 A1   2/2007
WO   WO 2008/042859 A2   4/2008

OTHER PUBLICATIONS

International Search Report and Written Opinion dated Nov. 23, 2012 in connection with Application No. PCT/US2012/026920.
(Continued)

*Primary Examiner* — Telly Green
(74) *Attorney, Agent, or Firm* — Wolf, Greenfield & Sacks, P.C.

(57) ABSTRACT

Embodiments of the invention are directed to IR photodetectors with gain resulting from the positioning of a charge multiplication layer (CML) between the cathode and the IR sensitizing layer of the photodetector, where accumulating charge at the CML reduces the energy difference between the cathode and the CML to promote injection of electrons that result in gain for an electron only device. Other embodiments of the invention are directed to inclusion of the IR photodetectors with gain into an IR-to-visible up-conversion device that can be used in night vision and other applications.

20 Claims, 5 Drawing Sheets

(51) Int. Cl.
*H01L 31/101* (2006.01)
*H01L 31/0232* (2014.01)
*H01L 51/42* (2006.01)
*H01L 31/032* (2006.01)
*H01L 31/0352* (2006.01)
*G02B 23/12* (2006.01)
*H01L 31/028* (2006.01)
*H01L 31/0304* (2006.01)
*H01L 51/00* (2006.01)
*H01L 27/30* (2006.01)

(52) U.S. Cl.
CPC ........ *H01L31/028* (2013.01); *H01L 31/02322* (2013.01); *H01L 31/032* (2013.01); *H01L 31/0304* (2013.01); *H01L 31/0324* (2013.01); *H01L 31/035218* (2013.01); *H01L 31/101* (2013.01); *H01L 51/4246* (2013.01); *H01L 27/305* (2013.01); *H01L 51/0053* (2013.01); *H01L 51/4293* (2013.01); *H01L 2251/308* (2013.01); *Y02E 10/549* (2013.01)

(56) References Cited

U.S. PATENT DOCUMENTS

| | | |
|---|---|---|
| 2005/0110007 A1 | 5/2005 | Forrest et al. |
| 2010/0044676 A1 | 2/2010 | Sargent et al. |
| 2010/0181552 A1 | 7/2010 | So |
| 2010/0233842 A1 | 9/2010 | Grein et al. |
| 2011/0012091 A1 | 1/2011 | Forrest et al. |
| 2011/0031399 A1 | 2/2011 | So |
| 2012/0126204 A1 | 5/2012 | So et al. |
| 2012/0187295 A1 | 7/2012 | So et al. |
| 2014/0353502 A1 | 12/2014 | So et al. |

OTHER PUBLICATIONS

International Preliminary Report on Patentability dated Sep. 12, 2013 in connection with Application No. PCT/US2012/026920.

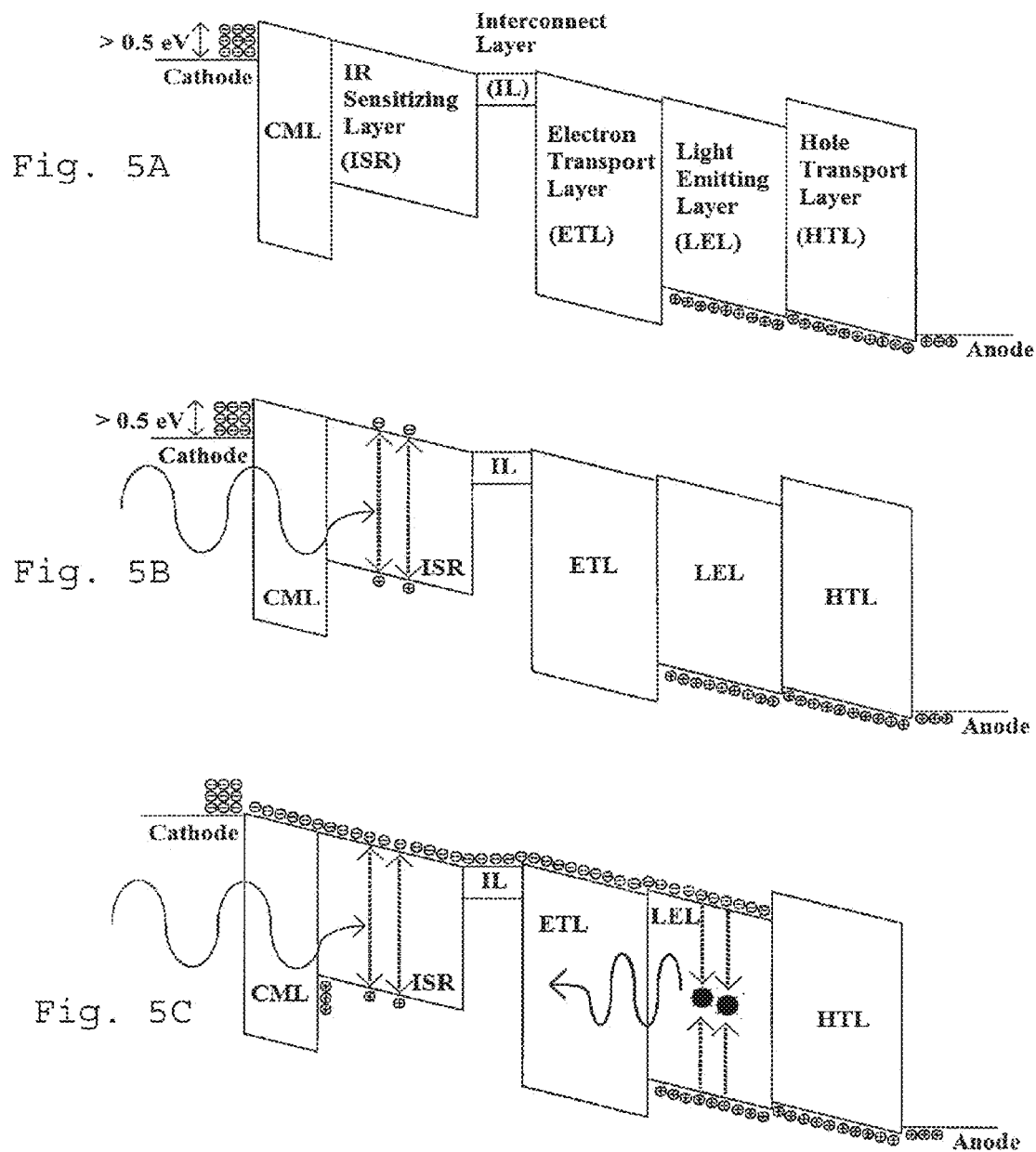

PHOTODETECTOR AND UP-CONVERSION DEVICE WITH GAIN

RELATED APPLICATIONS

This application is a divisional of U.S. patent application Ser. No. 14/463,546, filed Aug. 19, 2014, which is a continuation of U.S. patent application Ser. No. 13/407,094, filed Feb. 28, 2012, now U.S. Pat. No. 8,829,498, issued Sep. 9, 2014, which claims priority under 35 U.S.C. §119(e) to U.S. Provisional Application Ser. No. 61/447,406, filed Feb. 28, 2011, all of which are hereby incorporated by reference herein in their entireties, including any figures, tables, or drawings.

BACKGROUND OF INVENTION

Existing night vision goggles are complex electro-optical devices that intensify existing light instead of relying on their own light source. In a typical configuration, a conventional lens, called the objective lens, captures ambient light and some near-infrared light. The gathered light is then sent to an image-intensifier tube. The image-intensifier tube can use a photo cathode to convert the photons of light energy into electrons. As the electrons pass through the tube, more electrons can be released from atoms in the tube, multiplying the original number of electrons by a factor of thousands, often accomplished using a micro channel plate (MCP). The image-intensifier tube can be positioned such that cascaded electrons hit a screen coated with phosphors at the end of the tube where the electrons retain the position of the channel through which they passed. The energy of the electrons causes the phosphors to reach an excited state and release photons to create a green image on the screen that has come to characterize night vision. The green phosphor image can be viewed through an ocular lens where the image is magnified and focused.

Recently, light up-conversion devices have attracted a great deal of research interest because of their potential applications in night vision, range finding, and security, as well as semiconductor wafer inspections. Early near infrared (NIR) up-conversion devices were mostly based on the heterojunction structure of inorganic semiconductors where a photodetecting and a luminescent section are in series. The up-conversion devices are mainly distinguished by the method of photodetection. Up-conversion efficiencies of devices are typically very low. For example, one NIR-to-visible light up-conversion device that integrates a light-emitting diode (LED) with a semiconductor based photodetector exhibits a maximum external conversion efficiency of only 0.048 (4.8%) W/W. A hybrid organic/inorganic up-conversion device, where an InGaAs/InP photodetector is coupled to an organic light-emitting diode (OLED), exhibits an external conversion efficiency of 0.7% W/W. Currently inorganic and hybrid up-conversion devices are expensive to fabricate and the processes used for fabricating these devices are not compatible with large area applications. Efforts are being made to achieve low cost up-conversion devices that have higher conversion efficiencies, although none has been identified that allows sufficient efficiency for a practical up-conversion device. Hence there remains a need to achieve higher efficiencies of an up-conversion device that can employ IR photodetector and light emitter materials that are currently available and can be fabricated in a cost effective manner.

BRIEF SUMMARY

Embodiments of the invention are directed to an IR photodetector with gain comprising a cathode, an IR sensitizing material layer, a charge multiplication layer (CML), and an anode. The CML separates the IR sensitizing material layer from the cathode and has a LUMO level≥0.5 eV higher than the cathode's Fermi level, absent IR radiation. Alternately, the CML separates the IR sensitizing material layer from the anode and has a HOMO level≥0.5 eV lower than the anode's Fermi level, absent IR radiation. In embodiments of the invention, the IR sensitizing material layer comprises PCTDA, SnPc, SnPc:$C_{60}$, AlPcCl, AlPcCl:$C_{60}$, TiOPc, TiOPc:$C_{60}$, PbSe QDs, PbS QDs, PbSe, PbS, InAs, TnGaAs, Si, Ge, or GaAs and the CML comprises naphthalene tetracarboxylic anhydride (NTCDA), 2,9-Dimethyl-4,7-diphenyl-1, 10-phenanthroline (BCP), p-bis(triphenylsilyl)benzene (UGH2), 4,7-diphenyl-1,10-phenanthroline (BPhen), tris-(8-hydroxy quinoline) aluminum ($Alq_3$), 3,5'-N,N'-dicarbazole-benzene (mCP), $C_{60}$, tris[3-(3-pyridyl)mesityl]-borane (3TPYMB), ZnO or $TiO_2$. In other embodiments of the invention, the IR sensitizing material layer comprises PbSe QDs or PbS QDs and the CML comprises oleic acid, actylamine, ethanethiol, ethandithiol (EDT), or bensenedithiol (BTD). The IR photodetector with gain can further comprise a hole blocking layer that separates the IR sensitizing material layer from the anode.

Other embodiments of the invention are directed to up-conversion devices with gain that comprise the IR photodetector with gain and an organic light emitting diode (OLED). The OLED comprises the cathode, an electron transport layer (ETL), a light emitting layer (LEL), a hole transport layer (HTL), and the anode. The ETL comprises tris[3-(3-pyridyl)-mesityl]borane (3TPYMB), 2,9-Dimethyl-4,7-diphenyl-1, 10-phenanthroline (BCP), 4,7-diphenyl-1,10-phenanthroline (BPhen), or tris-(8-hydroxy quinoline) aluminum ($Alq_3$). The light emitting layer (LEL) comprises tris-(2-phenylpyidine) iridium, Ir(ppy)$_3$, poly-[2- methoxy, 5-(2'-ethyl-hexyloxy) phenylene vinylene] (MEH-PPV), tris-(8-hydroxy quinoline) aluminum ($Alq_3$), or iridium (III) bis-[(4,6-di-fluorophenyl)-pyridinate-N, C2']picolinate (Flrpic). The HTL comprises 1,1-bis[(di-4-tolylamino)phenyl]cyclohexane (TAPC), N,N'-diphenyl-N,N'(2-naphthyl)-(1,1'-phenyl)-4,4'-diamine (NPB), or N,N'diphenyl-N,N'-di(m-tolyl) benzidine (TPD). The up-conversion device with gain can further comprise an interconnect layer separating the IR photodetector with gain from the OLED. The interconnect layer comprises a thin metal or a stack interconnection layer.

BRIEF DESCRIPTION OF DRAWINGS

FIG. 5A shows a schematic energy band diagram of an infrared-to-visible light up-conversion device with gain, according to an embodiment of the invention, under applied voltage in the dark.

FIG. 5B shows a schematic energy band diagram of an infrared-to-visible light up-conversion device with gain, according to an embodiment of the invention, under applied voltage upon initial IR irradiation.

FIG. 5C shows a schematic energy band diagram of an infrared-to-visible light up-conversion device with gain, according to an embodiment of the invention, under applied voltage and IR irradiation, where the hole accumulation in the CML reduces the energy level difference, which reduces or removes the energy difference between its LUMO and the Fermi level of the cathode such that electrons injected by the cathode and generated by the photodetector are provided to the visible light emitting layer (LEL).

DETAILED DISCLOSURE

Figure 1A:
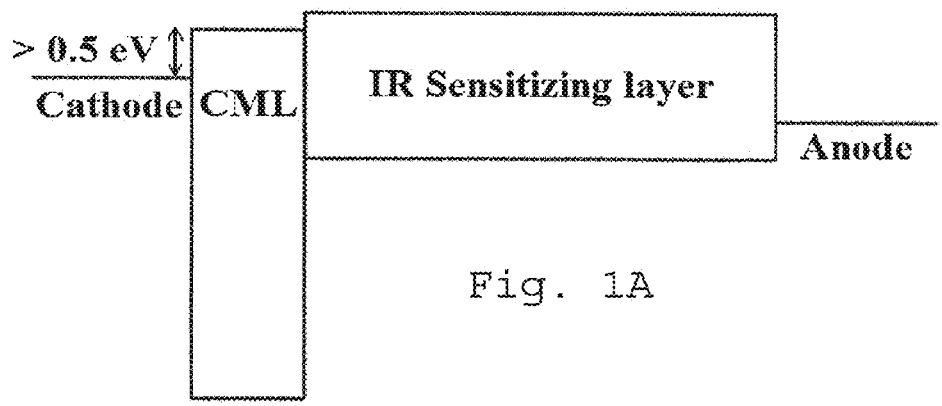
FIG. 1A shows a schematic energy band diagram of an IR photodetector with gain, according to an embodiment of the invention, without a hole blocking layer between the IR sensitizing layer and the anode.
Figure 1B:
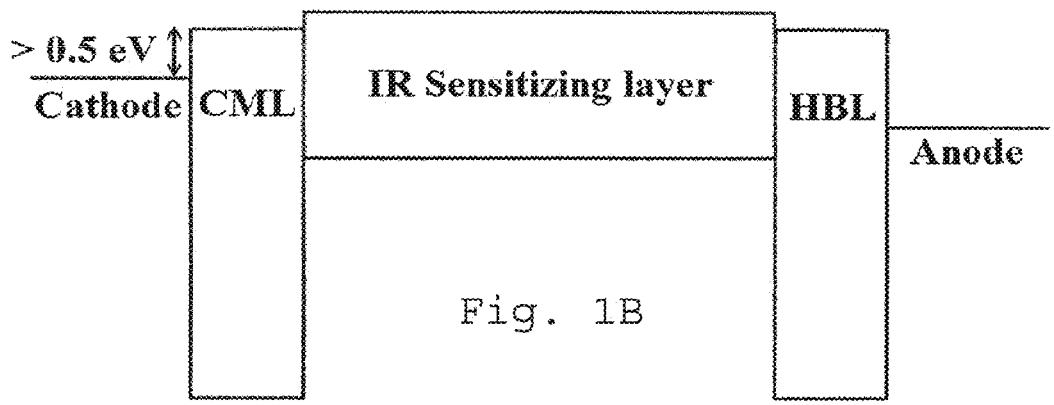
FIG. 1B shows a schematic energy band diagram of an IR photodetector with gain, according to an embodiment of the invention, with a hole blocking layer between the IR sensitizing layer and the anode.

Embodiments of the present invention are directed to an up-conversion device comprising a photodetector with gain. By the imposition of gain, the signal from the IR photodetector can be amplified such that the light emitter of the up-conversion device emits a higher intensity with greater contrast. Embodiments of the invention are directed towards the achievement of gain by coupling the photodetector with a charge multiplication layer (CML). A schematic for a photodetector with gain is shown in FIG. 1A, where the IR sensitizing layer, the photodetector, is separated from the cathode by a CML that is characterized by a deep highest occupied molecular orbital (HOMO) and a lowest unoccupied molecular orbital (LUMO) with an energy level, relative to the work function of the cathode, that results in an injection barrier in the absence of IR radiation of at least 0.5 eV. Optionally, in an embodiment of the invention, a hole blocking layer (HBL) is situated between the IR sensitizing layer and the anode, as shown in FIG. 1B.

Figure 2A:
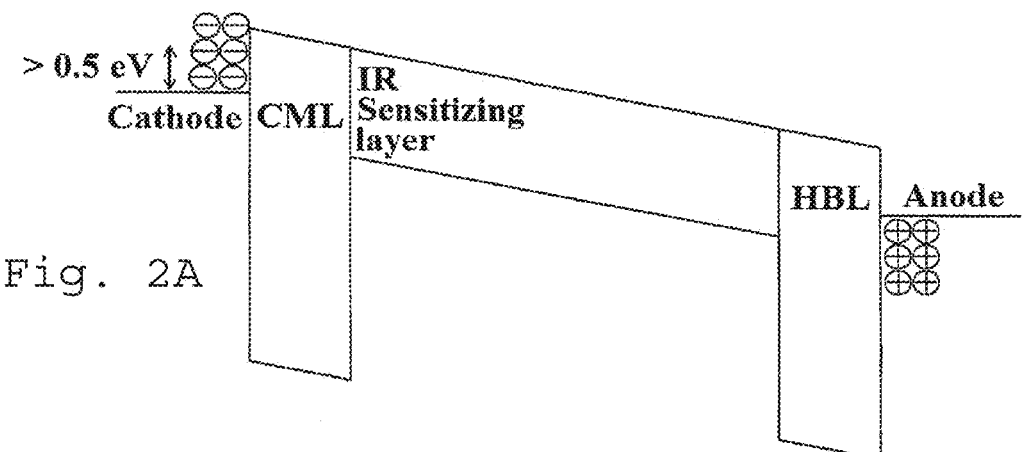
FIG. 2A shows a schematic energy band diagram of an IR photodetector with gain under applied voltage in the dark, according to an embodiment of the invention.
Figure 2B:
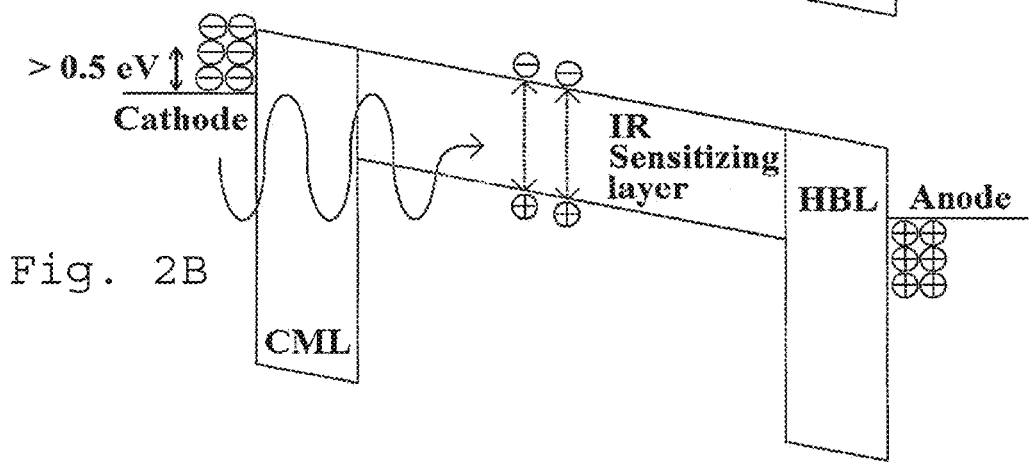
FIG. 2B shows a schematic energy band diagram of an IR photodetector with gain under applied voltage upon initial IR irradiation, according to an embodiment of the invention.
Figure 2C:
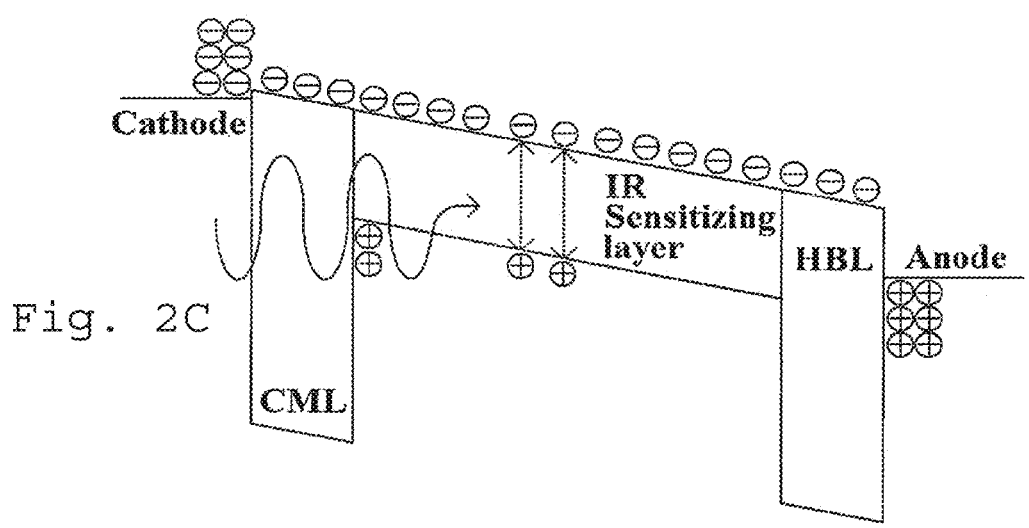
FIG. 2C shows a schematic energy band diagram of an IR photodetector with gain under applied voltage and IR irradiation, where the hole accumulation in the charge multiplication layer (CML) reduces the energy level difference, which reduces or removes the energy difference between its LUMO and the Fermi level of the cathode, which promotes electron injection from the cathode, according to an embodiment of the invention.

The manner in which the photodetector with gain, according to an embodiment of the invention, functions is schematically illustrated in FIG. 2A. With an applied bias in the dark, where no IR radiation illuminates the IR sensitizing layer, there is little or no injection of electrons from the cathode because of the CML's≥0.5 eV barrier, as indicated in FIG. 2A. As illustrated in FIG. 2, the device acts as an electron only device. Although this device, and most devices of this disclosure, are directed to an electron only device, it should be understood by those skilled in the art that a device that acts as a hole only device in the absence of IR radiation can be constructed in like manner for a device that has gain by imposition of the opposite electrical bias and a CML where an energy level relative to the work function of the anode promotes accumulation of electrons rather than holes. Upon IR irradiation, the IR sensitizing layer generates electron-hole pairs with the electrons flowing to the anode because of the applied bias, as illustrated in FIG. 2B. The counter flow of photogenerated holes results in the accumulation of holes at the CML, which diminishes the barrier for electron injection into the CML to less than 0.5 eV as shown in FIG. 2C and significantly increases the electron current towards the anode under the applied bias.

In embodiments of the invention, the IR photodetecting layer can be inorganic. In an exemplary up-conversion device, a layer of PbSe quantum dots (QDs) can be employed as the IR photodetector and MEH-PPV can be employed as the electroluminescent OLED. In addition to PbSe, other QDs that can be employed include, but are not limited to, PbS. Other inorganic materials that can be employed as IR photodetectors include, but are not limited to, continuous thin films of: PbSe, PbS, InAs, InGaAs, Si, Ge, or GaAs. In embodiments of the invention, the IR photodetector is an organic or organometallic comprising material including, but not limited to, perylene-3,4,9,10-tetracarboxylic-3,4,9,10-dianhydride (PTCDA), tin (II) phthalocyanine (SnPc), SnPc:$C_{60}$, aluminum phthalocyanine chloride (AlPcCl), AlPcCl:$C_{60}$, titanyl phthalocyanine (TiOPc), and TiOPc:$C_{60}$.

Figure 3A:
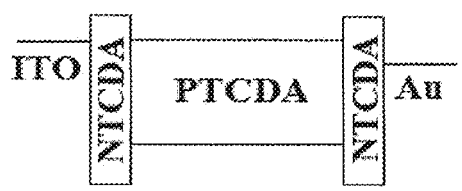
FIG. 3A shows an IR photodetector with an organic IR sensitizing layer, according to an embodiment of the invention, with a plot of the gain for the photodetector as a function of voltage.
Figure 3A:
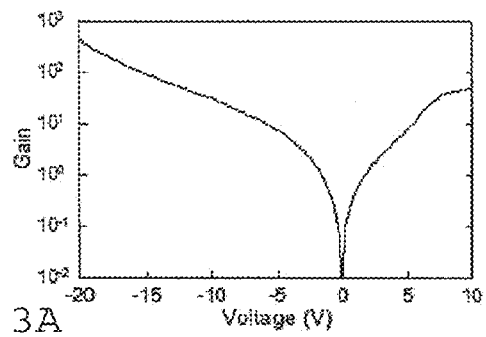
Figure 3B:
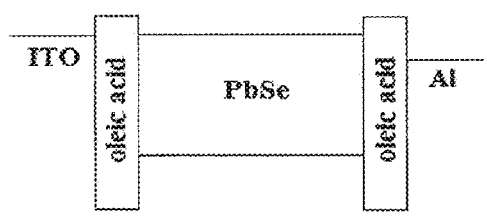
FIG. 3B shows an IR photodetector with an inorganic IR sensitizing layer, according to an embodiment of the invention, with a plot of the gain for the photodetector as a function of wavelength at various applied voltages.
Figure 3B:
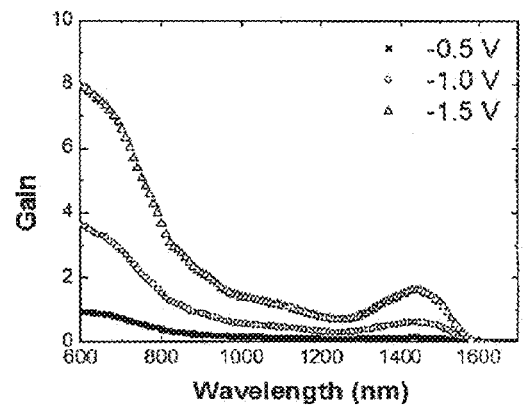

By including the CML, the IR photodetector displays gain such that the efficiency of an up-conversion device is improved. An exemplary CML is naphthalene tetracarboxylic anhydride (NTCDA). Other CMLs that can be employed in embodiments of the invention include, but are not limited to, 2,9-Dimethyl-4,7-diphenyl-1,10-phenanthroline (BCP), p-bis(triphenylsilyl)benzene (UGH2), 4,7-diphenyl-1,10-phenanthroline (BPhen), tris-(8-hydroxy quinoline) aluminum ($Alq_3$), 3,5'-N,N'-dicarbazole-benzene (mCP), $C_{60}$, tris [3-(3-pyridyl)-mesityl]borane (3TPYMB), ZnO, or $TiO_2$. When the IR photodetector is inorganic, the CML can be an organic ligand, such as oleic acid that caps the inorganic photosensitive material. The inclusion of the CML significantly improves the efficiency of the photodetector. For example, as shown in FIG. 3A, using a PTCDA IR sensitizing layer and a NTCDA CML, a gain in excess of 100 is observed when a potential of −20V is imposed across the electrodes. Using PbSe QDs as a photodetector and oleic acid, an organic ligand, a small potential, −1.5 V, is sufficient to generate a gain of up to 6 fold in the near IR, as shown in FIG. 3B.

Figure 4:
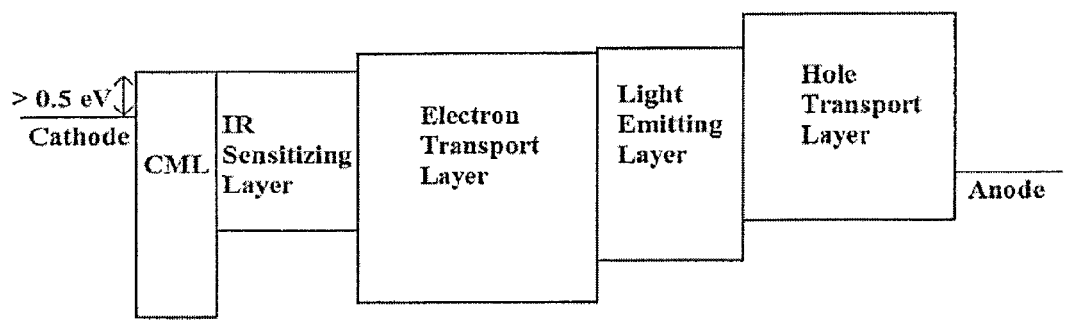
FIG. 4 shows a schematic energy band diagram of an infrared-to-visible light upconversion device with gain, according to an embodiment of the invention.

Other embodiments of the invention are directed to up-conversion devices having a photodetector with gain by including the CML. An exemplary schematic energy band diagram of an up-conversion device, according to an embodiment of the invention, is illustrated in FIG. 4. In addition to the IR photodetector and the CML, the up-conversion device comprises an anode, a cathode, a light emitting layer, a hole transport layer and an electron transport layer. The anode can be, but is not limited to, Indium tin Oxide (ITO), Indium Zinc Oxide (IZO), Aluminum Tin Oxide (ATO), Aluminum Zinc Oxide (AZO), carbon nanotubes, and silver nanowires. The materials that can be employed as the light emitting layers include, but are not limited to, tris-(2-phenylpyridine) iridium, Ir(ppy)$_3$, poly[2-methoxy, 5-(2'-ethyl-hexyloxy) phenylene vinylene] (MEH-PPV), tris-(8-hydroxy quinoline) aluminum ($Alq_3$), and iridium (III) bis-[(4,6-di-fluorophenyl)-pyridinate-N, C2']picolinate (FIrpic). The cathode can be LiF/Al or can be any conductor with the appropriate work function including, but not limited to, Ag, Ca, Mg, LiF/Al/ITO, Ag/ITO, $CsCO_3$/ITO and Ba/Al. Materials that can be employed as electron transport layers include, but are not limited to, tris[3-(3-pyridyl)-mesityl]borane (3TPYMB), 2,9-Dimethyl-4,7-diphenyl-1,10-phenanthroline (BCP), 4,7-diphenyl-1,10-phenanthroline (BPhen), and tris-(8-hydroxy quinoline) aluminum (Alq$_3$). Materials that can be employed as hole transport layers include, but are not limited to, 1,1-bis[(di-4-tolylamino)phenyl]cyclohexane (TAPC), N,N'-diphenyl-N,N'(2-naphthyl)-(1,1'-phenyl)-4,4'-diamine (NPB), and N,N'-diphenyl-N,N'-di(m-tolyl) benzidine (TPD). Those skilled in the art can readily identify appropriate combinations of anodes, cathodes, IR photodetectors, light emitting layers, hole transport layers, and electron transport layers by their relative work functions, HOMO and LUMO levels, layer compatibility, and the nature of any desired deposition methods used during their fabrication. An interconnect layer can also be included, as is shown in FIG. 5, where an interconnect layer connects the IR photodetecting portion of the up-conversion device to the light emitting portion of the device. When present, the interconnect layer can be a thin metal (for example about 0.5 to 3 nm thick Al, Ag, or Au) or a stack interconnection layer comprising an n-type doped organic layer/thin metal interconnecting layer/p-type doped organic layer where: the n-type doped organic layer can be, but is not limited to, Cs$_2$CO$_3$ doped Bphen, Cs$_2$CO$_3$ doped BCP, Cs$_2$CO$_3$ doped ZnO, Li doped Bphen, Li doped BCP, LiF doped Bphen, LiP doped BCP; the thin metal interconnecting layer can be about 0.5 to 3 nm thick Al, Ag, or Au; and the p-type doped organic layer can be, but is not limited to, MoO$_3$ doped TAPC, MoO$_3$ doped NPB, HAT CN doped TAPC, or HAT CN doped NPB.

As shown in FIG. 5, an up-conversion device allows the flow of electrons to the light emitting layer (LEL) only when the IR sensing layer generates holes and electrons, such that the CML promotes gain by the flow of electrons from the cathode, in addition to those generated by the IR sensing layer. In FIG. 5, the electron transport layer also functions as a hole blocking layer with respect to the IR sensing layer. Interconnect layers, as shown in FIG. 5, provide electron transport from the photodetector in an electron only device, as illustrated in FIG. 5. As can be appreciated by one skilled in the art, an interconnect layer in a hole only device would provide for hole transport.

Recently, a research group including some of the present inventors has disclosed in U.S. Provisional Application No. 61/347,696; filed May 24, 2010, and incorporated herein by reference, an IR-to-green light up-conversion device with an improved efficiency having a hole blocking layer (HBL) situated between the anode and the IR detection layer. For example, the HBL layer can be placed between an ITO anode and a SnPc:C$_{60}$ IR sensitizing layer, such that hole carriers from the ITO anode are efficiently blocked, suppressing visible luminance of the up-conversion device until a sufficiently high voltage and IR irradiation is applied. In embodiments of the invention that include a HBL, the HBL can be an organic compound or an inorganic compound. The organic HBL can comprise, for example, 2,9-Dimethyl-4, 7-diphenyl-1, 10-phenanthroline (BCP) or p-bis(triphenylsilyl)benzene (UGH2), under dark and IR irradiation. These HBL materials possess deep HOMO levels. Because these materials also have a small LUMO energy, charge generation between the hole blocking layer and the IR sensitizing layer is negligible. In addition to BCP and UGH2, other organic hole blocking layers that can be employed in embodiments of the invention include, but are not limited to, 4,7-diphenyl-1,10-phenanthroline (BPhen), tris-(8-hydroxy quinoline) aluminum (Alq$_3$), 3,5'-N,N'-dicarbazole-benzene (mCP), C$_{60}$, and tris [3-(3-pyridyl)mesityl] borane (3TPYMB). In embodiments of the invention including an inorganic HBL, the inorganic compound can be ZnO or TiO$_2$. Materials that can be employed as electron transport layers include, but are not limited to, tris[3-(3-pyridyl)-mesityl]borane (3TPYMB), 2,9-Dimethyl-4,7-diphenyl-1,10-phenanthroline (BCP), 4,7-diphenyl-1,10-phenanthroline (BPhen), and tris-(8-hydroxy quinoline) aluminum (Alq$_3$).

Embodiments of the invention pertain to methods and apparatus for detecting infrared (IR) radiation and providing a visible output. Because of their compatibility with light-weight rugged flexible plastic substrates, up-conversion devices, in accordance with embodiments of the present invention, can be used as a component, for example a pixel, for numerous applications including, but not limited to, night vision, range finding, security, and semiconductor wafer inspection.

METHODS AND MATERIALS

Organic photodetectors with gain having an area of 0.04 cm$^2$ were fabricated on patterned ITO substrates having a sheet resistance of 20 Ω per square. ITO substrates were cleaned with acetone and isopropanol in an ultrasonic cleaner, rinsed with de-ionized water, blown dry with N$_2$ gas, and treated with UV ozone for 15 minutes. PTCDA and NTCDA were purified by train sublimation two or more times. The organic photodetector with gain has the structure ITO/NTCDA (50 nm)/PTCDA (300 nm)/NTCDA (50 nm)/Au (100 nm), where the top three layers PTCDA, NTCDA and Au are the photo sensitizing layer, CML, and top electrode, respectively, and were vacuum deposited at a rate of 1 Å/s at a pressure of 1×10$^{-6}$ Torr. All layers were vacuum deposited at a pressure of 1×10$^{-6}$ Torr.

The current density versus voltage (J-V) characteristics were measured in the dark and under irradiation using a green laser of 532 nm wavelength from Lasermate Group, Inc. The light intensity, of 100 μW/cm$^2$, was controlled using a neutral density filter and a Newport Optical Power Meter 840-E. Gain was calculated as the ratio of the number of charge carriers flowing through the device by the light illumination to the number of photons absorbed by the organic film. The Au electrode was ground and the voltage bias was applied on ITO electrode. Device measurements were performed in air without encapsulation.

Inorganic photodetectors with gain, having an area of 0.04 cm$^2$, were fabricated on patterned ITO substrates having a sheet resistance of 20 Ω per square. PbSe nanocrystals with oleic acid capping groups were spin-coated on UV-ozone treated ITO-coated glass substrates inside a nitrogen glove box. A 100 nm thick Al cathode was thermally deposited at a pressure ~10$^{-6}$ Torr through a shadow mask with an active area of 4 mm$^2$. The final device has a structure of ITO/PbSe with oleic acid capping ligand/Al.

The current-voltage (I-V) characteristics of devices were measured with a Keithley 4200 semiconductor parameter analyzer. Devices were irradiated with monochromatic light from a Newport monochromator using an Oriel solar simulator as a source. The illumination intensities were measured using two calibrated Newport 918D photodiodes, one for the visible and the other for the infrared part of the spectrum. The intensity of the incident irradiation was varied by using a set of neutral density filters. To obtain the spectral response of the photodetectors, light from the monochromator was chopped at 400 Hz to modulate the optical signal. The photocurrent response as a function of bias voltage was measured using a Stanford Research System SR810 DSP lock-in amplifier.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. A method, comprising:
applying a bias voltage to a device comprising an anode, a cathode, an IR sensitizing material layer, and a charge multiplication layer (CML), wherein the CML separates the IR sensitizing material layer from the cathode or the anode; and
exposing the device to infrared radiation such that a current flows between the anode and the cathode.

2. The method of claim 1, wherein the CML comprises naphthalene tetracarboxylic anhydride (NTCDA), 2,9-dimethyl-4,7-diphenyl-1,10-phenanthroline (BCP), p-bis(triphenylsilyl)benzene (UGH2), 4,7-diphenyl-1,10-phenanthroline (BPhen), tris-(8-hydroxy quinoline) aluminum ($Alq_3$), 3,5'-N,N'-dicarbazole-benzene (mCP), $C_{60}$, tris[3-(3-pyridyl)-mesityl]borane (3TPYMB), ZnO or $TiO_2$.

3. The method of claim 2, wherein the CML comprises BCP.

4. The method of claim 1, wherein the IR sensitizing material layer comprises PCTDA, SnPc, SnPc:$C_{60}$, AlPcCl, AlPcCl:$C_{60}$, TiOPc, TiOPc:$C_{60}$, PbSe QDs, PbS QDs, PbSe, PbS, InAs, InGaAs, Si, Ge, or GaAs.

5. The method of claim 1, wherein the device further comprises an organic light-emitting diode (OLED), wherein the OLED comprises an electron transport layer (ETL), a light-emitting layer (LEL), and a hole transport layer (HTL).

6. The method of claim 5, wherein the HTL comprises TAPC.

7. The method of claim 5, further comprising:
flowing electrons from the cathode to the light-emitting layer of the OLED; and
emitting visible light.

8. A method, comprising:
applying a bias voltage to a device comprising an anode, a cathode, an IR sensitizing material layer, and a charge multiplication layer (CML), wherein the CML separates the IR sensitizing material layer from the cathode;
flowing electrons from the cathode to the CML, wherein the electrons accumulate at an interface between the cathode and the CML in the absence of IR radiation;
exposing the device to IR radiation;
generating pairs of electrons and holes in the IR sensitizing material layer, wherein electrons flow toward the anode and holes flow toward the cathode;
accumulating holes in the CML; and
flowing electrons that accumulated at the interface between the cathode and the CML toward the anode.

9. The method of claim 8, wherein the device further comprises an OLED, the method further comprising:
flowing electrons to the light emitting layer of the OLED; and
emitting visible light.

10. The method of claim 1, wherein the IR sensitizing material layer comprises PbSe QDs or PbS QDs and the CML comprises BCP.

11. The method of claim 1, wherein the device further comprises a hole blocking layer that separates the IR sensitizing material layer from the anode.

12. The method of claim 11, wherein the hole blocking layer comprises 2,9-dimethyl-4,7-diphenyl-1,10-phenanthroline (BCP),p-bis(triphenylsilyl)benzene (UGH2), 4,7-diphenyl-1,10-phenanthroline (BPhen), tris-(8-hydroxy quinoline) aluminum ($Alq_3$), 3,5'-N,N'-dicarbazole-benzene (mCP), $C_{60}$, tris[3-(3-pyridyl)-mesityl] borane (3TPYMB), ZnO, or $TiO_2$.

13. The method of claim 5, wherein the CML comprises BCP and the HTL comprises TAPC.

14. The method of claim 8, wherein the CML comprises naphthalene tetracarboxylic anhydride (NTCDA), 2,9-dimethyl-4,7-diphenyl-1,10-phenanthroline (BCP), p-bis (triphenylsilyl)benzene (UGH2), 4,7-diphenyl-1,10-phenanthroline (BPhen), tris-(8-hydroxy quinoline) aluminum ($Alq_3$), 3,5'-N,N'-dicarbazole-benzene (mCP), $C_{60}$, tris[3-(3-pyridyl)-mesityl]borane (3TPYMB), ZnO, or $TiO_2$.

15. The method of claim 14, wherein the CML comprises BCP.

16. The method of claim 8, wherein the IR sensitizing material layer comprises PCTDA, SnPc, SnPc:$C_{60}$, AlPcCl, AlPcCl:$C_{60}$, TiOPc, TiOPc:$C_{60}$, PbSe QDs, PbS QDs, PbSe, PbS, InAs, InGaAs, Si, Ge, or GaAs.

17. The method of claim 8, wherein the IR sensitizing material layer comprises PbSe QDs or PbS QDs and the CML comprises BCP.

18. The method of claim 8, wherein the device further comprises a hole blocking layer that separates the IR sensitizing material layer from the anode.

19. The method of claim 18, wherein the hole blocking layer comprises 2,9-dimethyl-4,7-diphenyl-1,10-phenanthroline (BCP),p-bis(triphenylsily)benzene (UGH2), 4,7-diphenyl-1,10-phenanthroline (BPhen), tris-(8-hydroxy quinoline) aluminum ($Alq_3$), 3,5'-N,N'-dicarbazole-benzene (mCP), $C_{60}$, tris[3-(3-pyridyl)-mesityl] borane (3TPYMB), ZnO, or $TiO_2$.

20. The method of claim 9, wherein the OLED comprises an electron transport layer (ETL), a light-emitting layer (LEL), and a hole transport layer (HTL), wherein the CML comprises BCP and the HTL comprises TAPC.

* * * * *